US006973468B2

(12) United States Patent
Koyanagi

(10) Patent No.: US 6,973,468 B2
(45) Date of Patent: Dec. 6, 2005

(54) DATA INTERPOLATING DEVICE AND METHOD, SAMPLING FUNCTION GENERATING DEVICE, DATA INTERPOLATING PROGRAM, AND RECORDED MEDIUM

(75) Inventor: Yukio Koyanagi, Saitama (JP)

(73) Assignee: Neuro Solutions Corp., Tokyo (JP)

( * ) Notice: Subject to any disclaimer, the term of this patent is extended or adjusted under 35 U.S.C. 154(b) by 0 days.

(21) Appl. No.: 10/725,311

(22) Filed: Dec. 2, 2003

(65) Prior Publication Data

US 2004/0107231 A1    Jun. 3, 2004

Related U.S. Application Data

(63) Continuation of application No. PCT/JP02/04988, filed on May 23, 2002.

(30) Foreign Application Priority Data

Jun. 8, 2001    (JP) .............................. 2001-173883

(51) Int. Cl.$^7$ ............................................. G06F 17/17
(52) U.S. Cl. ..................................... 708/290; 708/313
(58) Field of Search ................................ 708/290, 313

(56) References Cited

U.S. PATENT DOCUMENTS 5,018,090 A  *  5/1991  Shiratsuchi ................ 708/290

| | | | |
|---|---|---|---|
| 5,235,534 A | | 8/1993 | Potter |
| 5,473,555 A | | 12/1995 | Potter |
| 5,572,210 A | | 11/1996 | Toyoda |
| 6,515,608 B1 | * | 2/2003 | Koyanagi ................ 341/144 |
| 6,700,521 B2 | * | 3/2004 | Koyanagi ................ 341/144 |
| 6,735,608 B1 | * | 5/2004 | Koyanagi et al. ........... 708/290 |
| 6,748,409 B1 | * | 6/2004 | Toraichi et al. ............. 708/313 |

FOREIGN PATENT DOCUMENTS

| | | |
|---|---|---|
| EP | 0 355 293 B1 | 8/1997 |
| JP | 02-92109 | 3/1990 |
| JP | 06-283968 | 10/1994 |
| JP | 2000-010960 | 1/2000 |
| JP | 2000-148061 | 5/2000 |
| JP | 2000-350016 | 12/2000 |
| JP | 2001-136073 | 5/2001 |

* cited by examiner

*Primary Examiner*—D. H. Malzahn

(74) *Attorney, Agent, or Firm*—Connolly Bove Lodge & Hutz LLP; Larry J. Hume

(57) ABSTRACT

A data interpolating device comprises plural stages of delay circuits ($1_{-1}, 2_{-1}, 3_{-1}$) for delaying discrete data sequentially inputted and multiplication/addition circuits ($4_{-1}$ to $16_{-1}$) that performs weighted addition of data outputted from the output stages of the plural stages of delay circuits ($1_{-1}, 2_{-1}, 3_{-1}$) according to the value of a digital basic function (−1, 1, 8, 8, 1, −1) and thereby determine interpolation data. Since a sampling function of finite supports differentiable once or more times over the whole range.

13 Claims, 10 Drawing Sheets

|   | A | B | C | D | E | F | ... |
|---|---|---|---|---|---|---|---|
| a | -1<br>1<br>8<br>8<br>1 | -1<br>1 | | | | | |
| b | 1<br>-1 | 8<br>8 | -1<br>1 | | | | |
| c | | 1<br>-1 | 8<br>8 | -1<br>1 | | | |
| d | | | 1<br>-1 | 8<br>8 | -1<br>1 | | |
| e | | | | 1<br>-1 | 8<br>8 | -1<br>1 | |
| f | | | | | 1<br>-1 | 8<br>8<br>1<br>-1 | |

FIG. 13

| | A | B | C | D | E | F | .... |
|---|---|---|---|---|---|---|---|
| | 9 | −1 | | | | | |
| a | −16 | 0 | | | | | |
| | 9 | 9 | −1 | | | | |
| b | 0 | −16 | 0 | | | | |
| | 1 | 9 | 9 | −1 | | | |
| c | −1 | 0 | −16 | 0 | | | |
| | | −1 | 9 | 9 | −1 | | |
| d | | | 0 | −16 | 0 | | |
| | | | −1 | 9 | 9 | −1 | |
| e | | | | 0 | −16 | 0 | |
| | | | | −1 | 9 | 9 | |
| f | | | | | 0 | −16 | |
| | | | | | −1 | 9 | |
| | | | | | | 0 | |
| | | | | | | −1 | |

DATA INTERPOLATING DEVICE AND METHOD, SAMPLING FUNCTION GENERATING DEVICE, DATA INTERPOLATING PROGRAM, AND RECORDED MEDIUM

BACKGROUND OF THE INVENTION

1. Field of the Invention

The present invention relates to a data interpolating device and method, a sampling function generating device, a data interpolating program and a recorded medium, and more particularly to a data interpolating device and method, a sampling function generating device, a data interpolating program and a recorded medium that are suitable for interpolation of the discrete data such as voice or image.

2. Description of the Related Art

Conventionally, various data interpolating methods for interpolating a value between given sampling values have been proposed. The simplest method is a linear interpolation. In this linear interpolation, interpolation data represented by $(x1+x2)/2$ is employed as an intermediate value interpolating between two sampled values $x1$ and $x2$, for example.

Also, a data interpolating method employing a given sampling function is well known. For the data interpolation in this case, the sampling function as referred to as a sinc function is conventionally employed.

FIG. 1 is an explanatory view of a sinc function. The sinc function appears when a Dirac's delta function is subjected to inverse Fourier transform, and is defined such as $\sin(\pi ft)/(\pi ft)$ where the sampling frequency is f. This sinc function has the value 1 only at the sampling point $t=0$, and value 0 at all other sampling points.

FIG. 2 is an explanatory view of data interpolation using a sampling function as shown in FIG. 1. In FIG. 2, consider an instance wherein the interpolated value $y(t0)$ corresponding to a predetermined position $t0$ (distance a from $t2$) between sampling points $t2$ and $t3$, when the values of discrete data at sampling points $t1$, $t2$, $t3$ and $t4$ of equal interval are $Y(t1)$, $Y(t2)$, $Y(t3)$ and $Y(t4)$, respectively.

Generally, to determine the interpolated value $y(t0)$ using the sampling function, the values (indicated by x sign) at the interpolation position $t0$ for a plurality of sampling functions having the amplitude corresponding to the discrete data values $Y(t1)$ to $Y(t4)$ at the sampling points $t1$ to $t4$ are determined, and added by convolution operation.

This data interpolation is employed for a digital-analog conversion process for converting discrete digital data to a continuous analog signal, and an expansion process for expanding the data discretized at the time of compression to continuous original data by interpolation. In this case, it is required to interpolate the value between given discrete sampling points as smoothly as possible.

To deal with this requirement, in a conventional data interpolating method for artificially increasing the sampling frequency through the interpolation process, a stepwise signal waveform was generated by holding the interpolated values in a sample and hold circuit, and passed through a low pass filter to output a smooth signal.

However, this method had a problem that the output continuous signal is degraded in phase characteristic owing to the low pass filter.

Since the sinc function converges to 0 as t goes to $\pm\infty$, to acquire the correct interpolated values, it is required to add the values of the sinc function corresponding to all the discrete data values. In practice, the convolution operation is made in a limited range of discrete data considered owing to the processing capability and circuit scale. Therefore, there was a problem that the determined interpolated value contained a truncation error, and the correct interpolated values were not determined.

To solve these problems, the present applicant has invented a data interpolating system for providing the output waveform with less distortion without degraded phase characteristic or truncation error caused by the low pass filter, and already filed a patent (Japanese Patent Application No. 11-173245). The invention as described in Japanese Patent Application No. 11-173245 involves processing a digital basic function of FIG. 15 to have the amplitudes corresponding to n pieces of input discrete data, and synthesizing them with the over-sampling and convolution operation, and as a result, making data interpolation based on the sampling function as shown in FIG. 3.

The sampling function as shown in FIG. 3 is a function of finite supports differentiable once over the whole range, in which the sampling position t along the transverse axis has a finite value other than zero only within a finite local area, and all zero in the other area.

Also, the sampling function of FIG. 3 has a feature that the maximal value is at sampling point $t3$ alone, and the value is zero at four sampling points $t1$, $t2$, $t4$ and $t5$, and passes through all the sampling points required to acquire the smooth waveform signal.

In this manner, the function as shown in FIG. 3 is a sampling function of finite supports that is differentiable once over the whole range, and converges to zero at sampling points $t1$ and $t5$. Accordingly, employing the sampling function of FIG. 3, instead of the conventional sinc function as shown in FIG. 1, to make superposition of each discrete data, the value between discrete data is smoothly interpolated using a first order differentiable function. Thereby, the low pass filter is dispensed with, and the degradation in phase characteristic is prevented.

Since the sampling function of FIG. 3 converges to zero at sampling points $t1$ and $t5$, it is only necessary to take into consideration only the discrete data in a range from $t1$ to $t5$. Accordingly, when one interpolated value is determined, a limited number of discrete data are only considered, thereby greatly reducing the processing amount. And though the discrete data outside the range from $t1$ to $t5$ should be naturally considered, but are not ignored in consideration of the processing amount or precision. Theoretically, there is no need for considering them, whereby it is possible to prevent a truncation error from occurring.

However, the data interpolating system as described in Japanese Patent Application No. 11-173245 provides the excellent characteristics as described above, but was required to make more complex calculations with the convolution operation or moving average operation than the simple data interpolating method such as linear interpolation.

Thus, it is an object of the present invention to provide a smooth data interpolation based on a sampling function of finite supports differentiable once or more times over the whole range through the simpler calculation, thereby shortening the calculation time and simplifying the circuit for making the calculation.

SUMMARY OF THE INVENTION

The present invention provides a data interpolating device comprising plural stages of delay circuits for successively delaying discrete data sequentially inputted, and a multiplication/addition circuit that performs weighted addition of data outputted from the output stages of the plural stages of delay circuits according to the value of a digital basic function and thereby determines interpolation data for the discrete data sequentially inputted.

In the data interpolating device, a plurality of over-sampling circuits may be cascade connected, when one set of over-sampling circuit consists of the plural stages of delay circuits and the multiplication/addition circuit.

Also, this invention provides a data interpolating device comprising three stages of delay circuits for successively delaying discrete data sequentially inputted, and a multiplication/addition circuit that performs weighted addition of data outputted from the output stages of the three stages of delay circuits according to the value of a digital basic function and thereby determines interpolation data for the discrete data sequentially inputted.

In the data interpolating device, a plurality of over-sampling circuits may be cascade connected, when one set of over-sampling circuit consists of the three stages of delay circuits and the multiplication/addition circuit.

Also, the invention provides a data interpolating device comprising plural stages of delay circuits for successively delaying discrete data sequentially inputted, a multiplication/addition circuit that performs weighted addition of data outputted from the output stages of the plural stages of delay circuits according to the value of a digital basic function and thereby determines interpolation data for the discrete data sequentially inputted, and an averaging circuit for calculating the average data of adjacent interpolation data output from the multiplication/addition circuit.

In the data interpolating device, a plurality of over-sampling circuits may be cascade connected, when one set of over-sampling circuit consists of the plural stages of delay circuits, the multiplication/addition circuit and the averaging circuit.

Also, the invention provides a data interpolating device comprising four stages of delay circuits for successively delaying discrete data sequentially inputted, and a multiplication/addition circuit that performs weighted addition of data outputted from the output stages of the four stages of delay circuits according to the value of a digital basic function and thereby determines interpolation data for the discrete data sequentially inputted.

In the data interpolating device, a plurality of over-sampling circuits may be cascade connected, when one set of over-sampling circuit consists of the four stages of delay circuits and the multiplication/addition circuit.

Also, the invention provides a data interpolating device comprising five stages of delay circuits for successively delaying discrete data sequentially inputted, and a multiplication/addition circuit that performs weighted addition of data outputted from the output stages of the five stages of delay circuits according to the value of a digital basic function and thereby determines interpolation data for the discrete data sequentially inputted.

In the data interpolating device, a plurality of over-sampling circuits may be cascade connected, when one set of over-sampling circuit consists of the five stages of delay circuits and the multiplication/addition circuit.

Also, the invention provides a data interpolating device comprising data acquisition means for acquiring discrete data at a sampling point of notice and discrete data at neighboring sampling points around the sampling point of notice when the discrete data are sequentially inputted, and interpolation means that performs weighted addition of discrete data acquired by the data acquisition means according to the value of a digital basic function and thereby determines interpolation data for the discrete data at the sampling point of notice successively.

In the data interpolating device, the operation of the data acquisition means and the interpolation means may be repeated multiple times by setting the output data of the interpolation means as the input of the data acquisition means.

The data interpolating device may further comprise averaging means for performing an averaging operation of adjacent interpolation data for the interpolation data determined by the interpolation means.

The invention provides a data interpolating method comprising performing weighted addition of discrete data at a sampling point of notice and discrete data at surrounding sampling points around the sampling point of notice according to the value of a digital basic function and thereby determining interpolation data for the discrete data at the sampling point of notice, when the discrete data are sequentially inputted.

The data interpolating method may further comprise performing an averaging operation of adjacent interpolation data for the interpolation data determined by performing weighted addition of the discrete data according to the value of the digital basic function.

The data interpolating method may further comprise performing weighted addition of interpolation data at a sampling point of notice and interpolation data at surrounding sampling points around the sampling point of notice according to the value of the digital basic function, when the interpolation data are determined by performing weighted addition of discrete data according to the value of the digital basic function, and thereby further determining interpolation data for the interpolation data at the sampling point of notice.

The invention provides a data interpolating method, comprising performing weighted addition of discrete data at a sampling point of notice and discrete data at its adjacent sampling points according to the value of a digital basic function when the discrete data are sequentially inputted and thereby successively determining interpolation data at two sampling points from the discrete data at the one sampling point.

Also, the invention provides a data interpolating method comprising performing weighted addition of discrete data at two adjacent sampling points of notice and discrete data at its adjacent sampling points of the two sampling points according to the value of a digital basic function when the discrete data are sequentially inputted and thereby successively determining interpolation data interpolating between the two sampling points.

This invention provides a sampling function generating device comprising plural stages of delay circuits for successively delaying singly inputted discrete data, a multiplication/addition circuit that performs weighted addition of data outputted from the output stages of the plural stages of delay circuits according to the value of a digital basic function and thereby determines interpolation data for the singly inputted discrete data, and a plurality of over-sampling circuits that are cascade connected when one set of over-sampling circuit consists of the plural stages of delay circuits and the multiplication/addition circuit.

The invention provides a data interpolation program for enabling a computer to operate as each means described herein or to perform a processing procedure of the data interpolation method according to various embodiments and aspects of the disclosure.

Also, the invention provides a computer readable recorded medium storing a program for enabling a computer to operate as each means described herein or to perform a processing procedure of the data interpolation method according to various embodiments and aspects of the disclosure.

BRIEF DESCRIPTION OF THE DRAWINGS

FIG. 13 is a diagram for explaining a principle of data interpolation according to a second embodiment;

DETAILED DESCRIPTION OF THE PREFERRED EMBODIMENTS (First Embodiment)

A first embodiment of the present invention will be described below with reference to the accompanying drawings.

Figure 4:
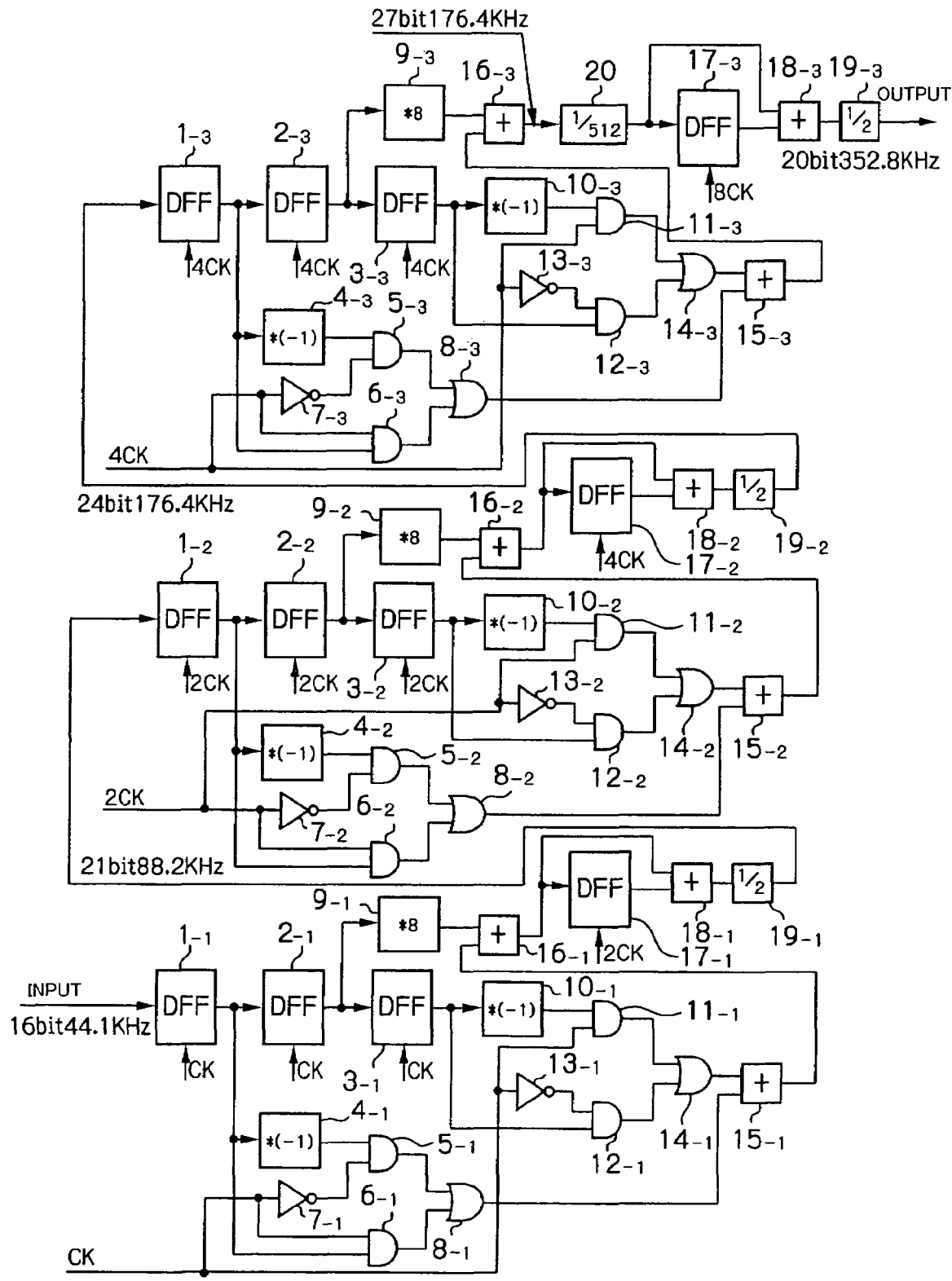
FIG. 4 is a diagram showing a configuration example of a data interpolating device according to a first embodiment.
Figures 5, 6:
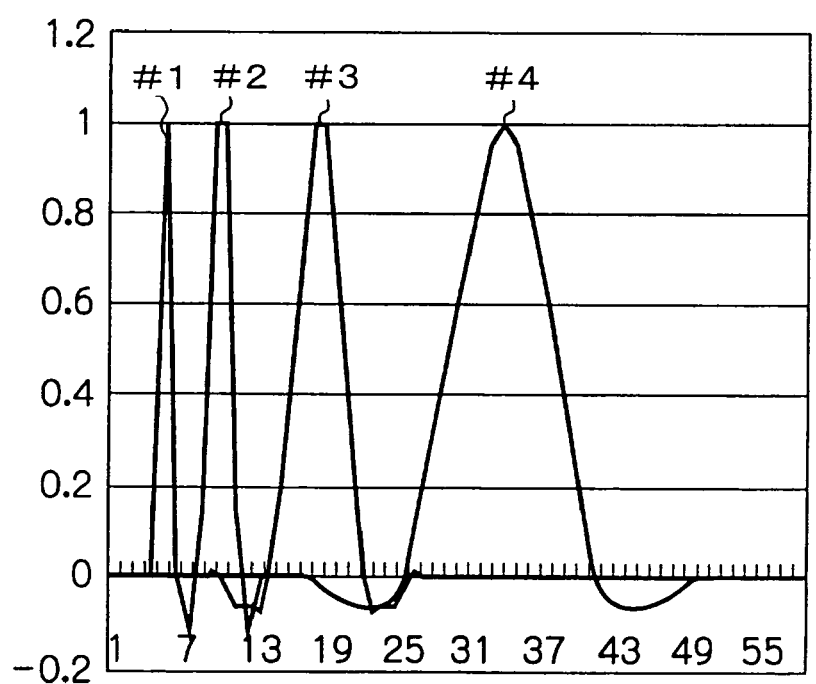
FIG. 5 is a diagram for explaining a principle of data interpolation according to the first embodiment.
FIG. 6 is a characteristic graph showing the over-sampled result obtained when unit pulse data is input into the data interpolating device as shown in FIG. 4.

FIG. 4 is a diagram showing a configuration example of a data interpolating device according to the first embodiment. FIG. 5 is a diagram for explaining a principle of data interpolation according to the first embodiment. Referring firstly to FIG. 5, the principle of data interpolation according to this embodiment will be described below.

In a data structure as shown in FIG. 5, A, B, C, . . . along the transverse axis indicate discrete data at each sampling point sequentially inputted at every clock, in which its data value becomes a coefficient of a digital basic function. Also, a, b, c, . . . along the longitudinal axis indicate a central position of discrete data processed by the digital basic function.

The digital basic function as used herein is a base for a sampling function useful in making data interpolation by over-sampling, as shown in FIG. 13. This digital basic function is produced by changing data value such as −1, 1, 8, 8, 1 and −1 at every clock.

As shown in FIG. 5, the digital basic function for discrete data A is given by shifting each function value (−1, 1, 8, 8, 1, −1) by every one clock from the start point that is the first clock position. Also, the digital basic function for the next discrete data B is given by shifting each function value by every one clock from the start point that is a clock position two clocks after the first clock position. Similarly, the digital basic function for discrete data C, D, E, F, . . . sequentially inputted is given by shifting each function value by every one clock from the start point that is a clock position more two clocks delayed.

An instance where two interpolation data B1, B2 are produced from one discrete data B on the basis of this data structure. Herein, assuming that two lines of data across the central position b of the discrete data B processed by the digital basic function are b1 and b2, the convolution operation of the data b1 and b2 is performed. In this case, two adjacent data values b1 and b2 are represented such as $$b1 = A + 8B - C \quad (1)$$

$$b2 = -A + 8B + C \quad (2)$$

From the above expressions (1) and (2), $$b1 + b2 = 16B \quad (3)$$

results, and is further transformed such as $$B = (b1/8 + b2/8)/2 \quad (4)$$

From the above expression (4), it will be found that the discrete data B corresponds to an intermediate value between two data $b1/8$ and $b2/8$. Conversely, one discrete data B is replaced with two interpolation data B1 and B2, which are represented such as $$B1 = (A + 8B - C)/8 \quad (5)$$

$$B2 = (-A + 8B + C)/8 \quad (6)$$

Since the relation of expression (4) for the discrete data B similarly holds for other discrete data C, D, E, F, . . . , $$C = (c1/8 + c2/8)/2$$

$$D = (d1/8 + d2/8)/2$$

$$E = (e1/8 + e2/8)/2$$

$$F = (f1/8 + f2/8)/2$$

are obtained.

Accordingly, one discrete data C is replaced with two interpolation data C1 and C2, one discrete data D is replaced with two interpolation data D1 and D2, one discrete data E is replaced with two interpolation data E1 and E2, and one discrete data F is replaced with two interpolation data F1 and F2, as shown in the following expressions.

$$C \to C1 = (B + 8C - D)/8, \quad C2 = (-B + 8C + D)/8$$

$$D \to D1 = (C + 8D - E)/8, \quad D2 = (-C + 8D + E)/8$$

$$E \to E1 = (D + 8E - F)/8, \quad E2 = (-D + 8E + F)/8$$

$$F \to F1 = (E + 8F - G)/8, \quad F2 = (-E + 8F + G)/8$$

As above described, when the interpolation value is obtained for the discrete data (e.g., B) at a certain sampling point, the value of the discrete data at the sampling point multiplied by 8 and the values of the discrete data at previous and next sampling points multiplied by +1 and −1 are added, and the added value is divided by 8 to obtain a first interpolated value (e.g., B1). Also, the value of the discrete data of object multiplied by 8 and the values of the discrete data at the previous and next sampling points multiplied by −1 and +1 are added, and the added value is divided by 8 to obtain a second interpolation value (e.g., B2). By performing this operation for each sampling point, the original data is over-sampled twice.

Also, if the same interpolating process is performed based on the interpolation data over-sampled twice, the original data is over-sampled four times. Moreover, if the same interpolating process is performed based on the interpolation data over-sampled four times, the original data is over-sampled eight times. Theoretically, if the same interpolating process is repeated n times, the original data is over-sampled $2^n$ times.

Referring to FIG. 4, the configuration of the data interpolating device for implementing the interpolating operation according to the first embodiment will be described below.

The data interpolating device as shown in FIG. 4 is configured such that three stages of two-fold over-sampling circuits are cascade connected, in which the circuit configurations at the first to third stages are distinguished by subscript (−1 to −3). Also, the circuit configuration having the same main symbol with different subscript has the same function.

The first stage over-sampling circuit operates in accordance with the clock CK of a reference frequency (e.g., 44.1 KHz). Three stages of D-type flip-flops $1_{-1}$, $2_{-1}$ and $3_{-1}$ delay discrete data inputted in sequence (for example, 16 bits) every one clock CK of a reference frequency sequencially. These D-type flip-flops $1_{-1}$, $2_{-1}$, and $3_{-1}$ correspond to three stages of delay circuits according to the invention.

Data taken out from an output tap of the first stage D-type flip-flop $1_{-1}$ forms the first term as represented by the expressions (5) and (6), data taken out from an output tap of the second stage D-type flip-flop $2_{-1}$ forms the second term, and data taken out from an output tap of the third stage D-type flip-flop $3_{-1}$ forms the third term, for example.

Data taken out from the output tap of the first stage D-type flip-flop $1_{-1}$ is entered via a −1 time multiplication unit $4_{-1}$ (corresponding to the first multiplication unit as defined in claim 3) into one input terminal of an AND gate $5_{-1}$, and entered into one input terminal of an AND gate $6_{-1}$ without interposition of the multiplication unit (corresponding to the +1 time). A reverse clock CK passing through an inverter $7_{-1}$ is input at the other input end of the AND gate $5_{-1}$. Also, clock CK is input at the other input end of an AND gate $6_{-1}$.

The output data of the two AND gates $5_{-1}$ and $6_{-1}$ are output via an OR gate $8_{-1}$. Thereby, the discrete data multiplied by +1 is output from the OR gate $8_{-1}$ during the period for which the clock CK is at "H". Also, the discrete data multiplied by −1 is output from the OR gate $8_{-1}$ during the period for which the clock CK is at "L". That is, the first term of the expression (5) is obtained during the period for which the clock CK is at "H", and the first term of the expression (6) is obtained during the period for which the clock CK is at "L". A first switching circuit as defined in claim 3 is composed of the two AND gates $5_{-1}$ and $6_{-1}$, the inverter $7_{-1}$ and the OR gate $8_{-1}$.

Data taken out from the output tap of the second stage D-type flip-flop $2_{-1}$ is entered via a +8 times multiplication unit $9_{-1}$ (corresponding to the second multiplication unit as defined in claim 3). Since the second term is not changed in ± sign in both the expressions (5) and (6), there is no need for a sign switching circuit with the clock CK as in the first term.

Also, data taken out from the output tap of the third stage D-type flip-flop $3_{-1}$ is entered via a −1 time multiplication unit $10_{-1}$ (corresponding to the third multiplication unit as defined in claim 3) into one input terminal of an AND gate $11_{-1}$, and entered into one input terminal of an AND gate $12_{-1}$ without interposition of the multiplication unit (corresponding to the +1 time). A clock CK is input into the other input end of the AND gate $11_{-1}$. Also, a reverse clock CK passing through an inverter $13_{-1}$ is input at the other input end of the AND gate $12_{-1}$.

The output data of the two AND gates $11_{-1}$ and $12_{-1}$ are output via an OR gate $14_{-1}$. Thereby, the discrete data multiplied by −1 is output from the OR gate $14_{-1}$ during the period for which the clock CK is at "H". Also, the discrete data multiplied by +1 is output from the OR gate $14_{-1}$ during the period for which the clock CK is at "L". That is, the third term of the expression (5) is obtained during the period for which the clock CK is at "H", and the third term of the expression (6) is obtained during the period for which the clock CK is at "L". A second switching circuit as defined in claim 3 is composed of the two AND gates $11_{-1}$ and $12_{-1}$, the inverter $13_{-1}$ and the OR gate $14_{-1}$.

The output data of the OR gate $8_{-1}$, the output data of the 8 times multiplication unit $9_{-1}$ and the output data of the OR gate $14_{-1}$ are added by two adders $15_{-1}$ and $16_{-1}$ (corresponding to the adder as defined in claim 3). Thereby, the operation result of the expression (5) is output from adder $16_{-1}$ during the period for which the clock CK is at "H", and the operation result of the expression (6) is output from adder $16_{-1}$ during the period for which the clock CK is at "L".

If the discrete data A, B, C, . . . as shown in FIG. 5 is sequentially input into the above circuit, the interpolation data over-sampled twice such as A, B1, B2, C1, C2, . . . are output from the adder $16_{-1}$. Though the data value is wholly multiplied by ⅛ in the expressions (5) and (6), no circuit therefor is provided in the first stage over-sampling circuit. In the circuit of FIG. 4, data at three stages are multiplied by ¹⁄₅₁₂ (⅛³) in a multiplication unit 20 at the final stage.

In the data interpolating device as shown in FIG. 4, when the interpolation data B1 and B2 are produced from one discrete data B, for example, the second terms of the expressions (5) and (6) common in both the interpolation data share one 8 times multiplication unit $9_{-1}$ to form the data. In this manner, the circuit to be shared in producing two interpolation data is shared if possible, simplifying the entire circuit configuration.

An averaging circuit composed of the D-type flip-flop $17_{-1}$, an adder $18_{-1}$, and a ½ times multiplication unit $19_{-1}$ is provided at the output stage of the adder $16_{-1}$. The D-type flip-flop $17_{-1}$ delays the output data of the adder $16_{-1}$ by one clock in accordance with the clock 2CK that is twice the reference frequency. The adder $18_{-1}$ adds the output data of the adder $16_{-1}$ and the output data of the D-type flip-flop $17_{-1}$. The ½ times multiplication unit $19_{-1}$ multiplies the output data of adder $18_{-1}$ by ½.

The reason of providing the averaging circuit is to restore a deviation in the relative position of clock caused by the interpolation process. For example, when the interpolation data B1, B2, C1, C2, . . . are output from the adder $16_{-1}$, the averaging circuit performs the operations (B1+B2)/2, (B2+C1)/2, (C1+C2)/2, . . . successively.

The execution result of this averaging operation is as follows.

$$(B1+B2)/2=\{\{(A+8B-C)/8\}+\{(-A+8B+C)/8\}\}/2=B$$

$$(B2+C1)/2=\{\{(-A+8B+C)/8\}+\{(B+8C-D)/8\}\}/2=(-A+9B+9C-D)/16 \quad (7)$$

$$(C1+C2)/2=\{\{(B+8C-D)/8\}+\{(-B+8C+D)/8\}\}/2=C$$

As a result, the deviation in the relative position of clock is restored to the original correct position. Thereby, it is possible to make better the frequency characteristics of the obtained sampling function as will be described later with reference to FIG. 9.

The output data of ½ times multiplication unit $19_{-1}$ composing the averaging circuit is input into the D-type flip-flop $1_{-2}$ of the second stage over-sampling circuit, so that the two-fold over-sampling at the second stage is performed. The over-sampling circuit at the second stage is the same as that at the first stage, except that it operates in accordance with the clock 2CK that is twice the reference frequency.

The output data of ½ times multiplication unit $19_{-1}$ provided at the final stage of the second stage over-sampling circuit is input into the D-type flip-flop $1_{-3}$ of the third stage over-sampling circuit, so that the two-fold over-sampling at the third stage is performed. The over-sampling circuit at the third stage is the same as that at the first stage, except that it operates in accordance with the clock 4CK that is four times the reference frequency.

FIG. 6 is a characteristic graph showing the over-sampled result obtained when unit pulse data is input into the data interpolating device as shown in FIG. 4. In FIG. 6, #1 input data of unit pulse, #2 two-fold over-sampled data, #3 four-fold over-sampled data, and #4 eight-fold over-sampled data are shown. A waveform function of over-sampled data as indicated by #4 has the almost same waveform as the sampling function obtained by the convolution operation as described in Japanese Patent Application No. 11-173245, as shown in FIG. 3.

Figure 1:
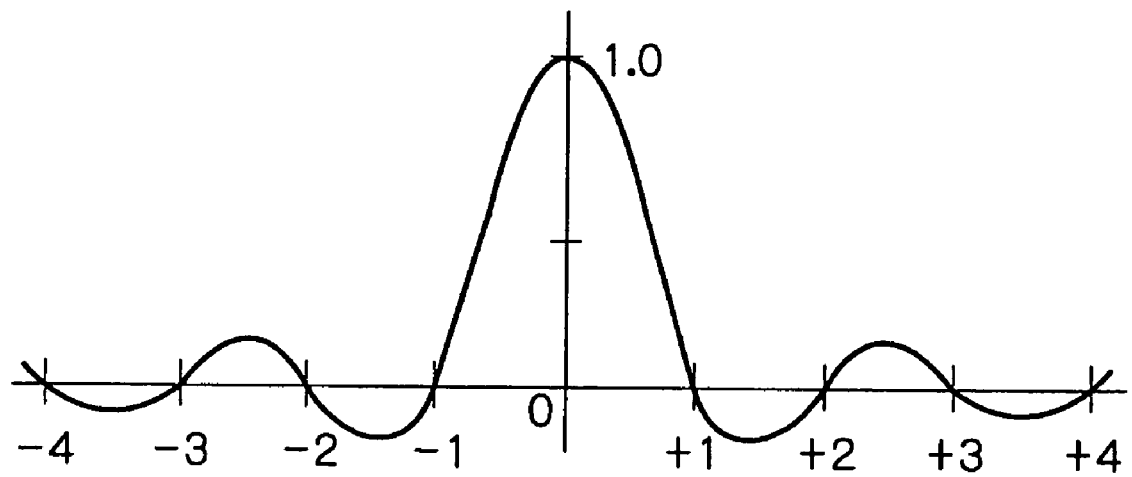
FIG. 1 is an explanatory view of a sinc function.
Figure 2:
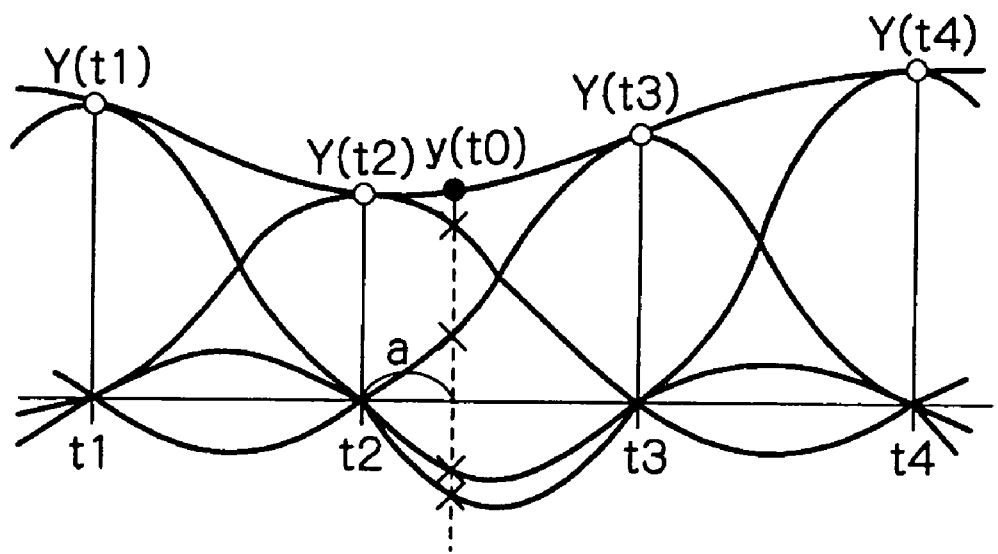
FIG. 2 is an explanatory view of data interpolation using a sampling function as shown in FIG. 1.
Figure 3:
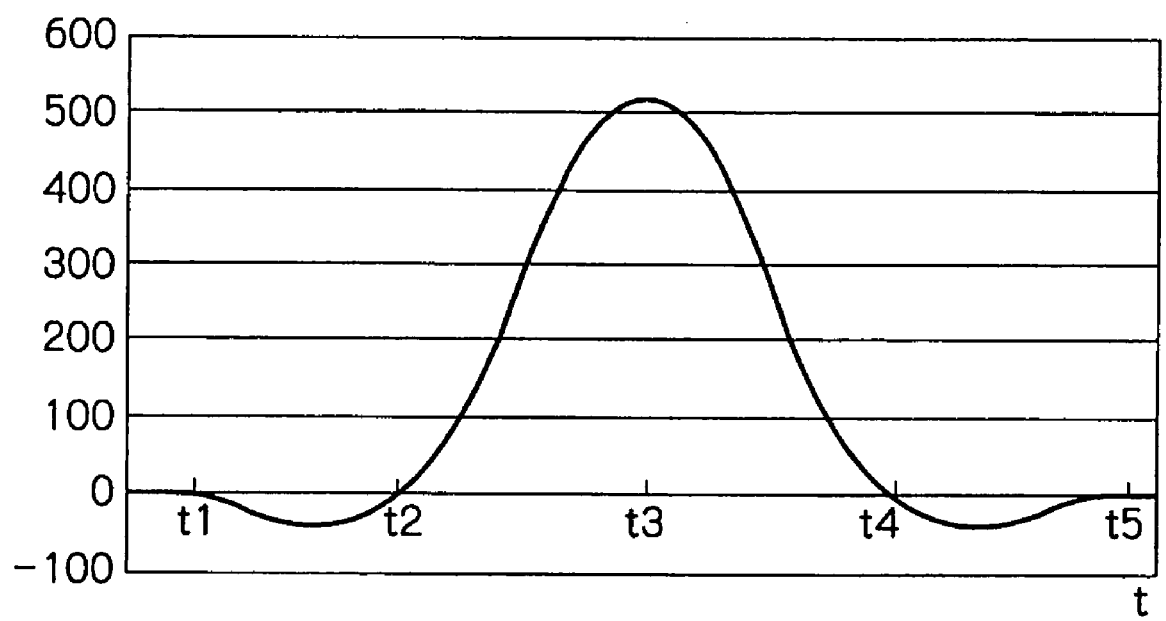
FIG. 3 is a characteristic graph showing a conventional sampling function generated from a digital basic function as shown in FIG. 15.
Figure 7:
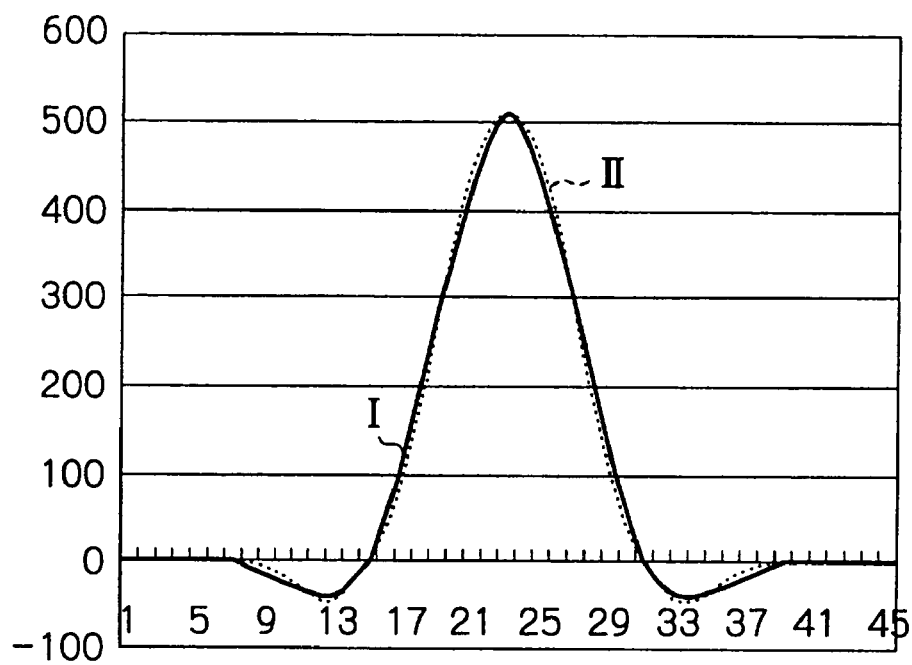
FIG. 7 is a characteristic graph showing the comparison of a waveform function as indicated by #4 in FIG. 6 and a waveform function as shown in FIG. 3.

For reference, the waveform function as indicated by #4 in FIG. 6 and the waveform function as shown in FIG. 3 are shown on the same plane for comparison in FIG. 7. In FIG. 7, graph I of solid line is the waveform function as indicated by #4 in FIG. 6 and graph II of dotted line is the waveform function as shown in FIG. 3. As will be apparent from these graphs, there is almost no difference in both the waveforms, and these graphs represent the sampling function of finite supports converging to zero at finite sampling positions. And the function as indicated by #4 in FIG. 6 is differentiable once or more times over the whole range.

Accordingly, in the case where the data interpolating process of this embodiment is applied, superposition is made based on each discrete data, employing the sampling function as indicated by #4 in FIG. 6 as a result, whereby it is possible to interpolate more smoothly the value between each discrete data, employing the first or higher order differentiable function. Thereby, the low pass filter is dispensed with, and the degradation in the phase characteristic is prevented.

Also, in the case where the interpolation value for one discrete data is obtained, it is only necessary to take into consideration the values for a limited number of discrete data (three as represented in the expressions (5) and (6)), whereby it is possible to reduce the processing amount significantly. Though each discrete data outside the range of finite supports should be naturally considered, but are not ignored in consideration of the processing amount or precision. Theoretically, there is no need for considering them, whereby it is possible to prevent a truncation error from occurring.

Figure 8:
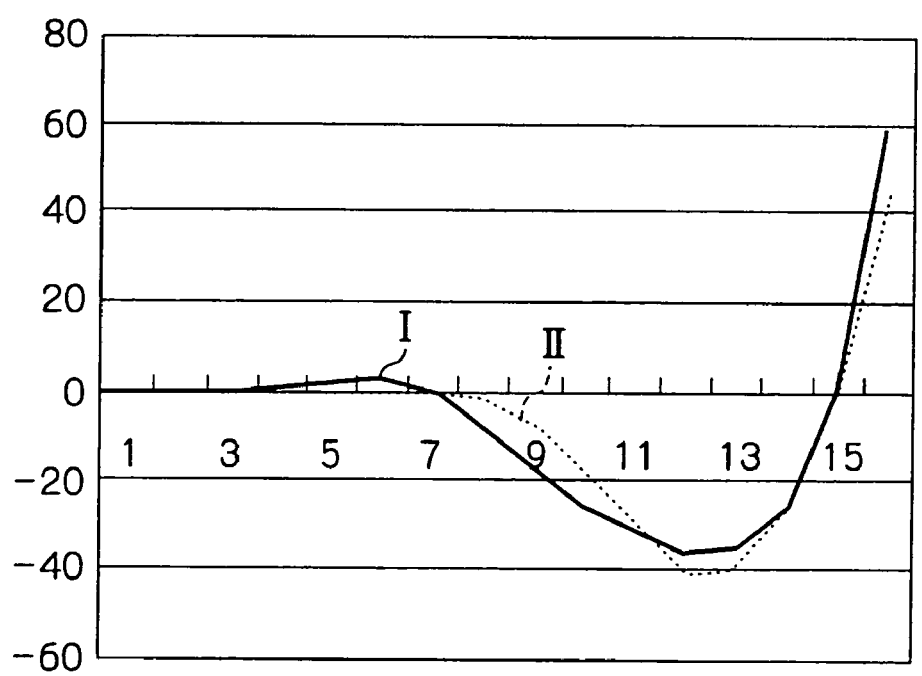
FIG. 8 is a graph, partially enlarged, of a sampling function as shown in FIG. 7.

FIG. 8 is a graph, partially enlarged, of the sampling function as shown in FIG. 7. As shown in FIG. 8, the sampling function 11 acquired from Japanese Patent Application No. 11-173245 is compulsorily converged to zero at sampling point t=7. However, the sampling function I in this embodiment is not compulsorily truncated. Accordingly, according to this embodiment, it is possible to interpolate between each discrete data more smoothly.

Figure 9:
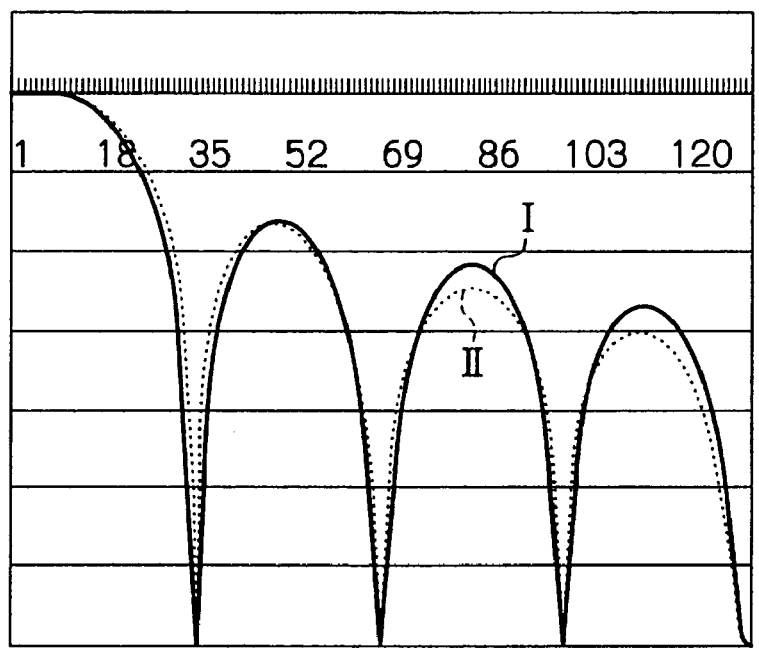
FIG. 9 is a graph representing the frequency characteristic of the sampling function as shown in FIG. 7.

FIG. 9 is a graph representing the frequency characteristic of the sampling function as shown in FIG. 7. In FIG. 9, graph I of solid line represents the frequency characteristics of the sampling function acquired in this embodiment, and graph II of dotted line represents the frequency characteristics of the sampling function acquired from Japanese Patent Application No. 11-173245. As will be seen from FIG. 9, the extremely excellent frequency characteristics are obtained in both graphs. Thereby, a notch filter is placed where a so-called reflected noise appears, whereby the reflected noise is effectively suppressed.

As described above in detail, according to the first embodiment, the sampling function of finite supports differentiable once or more times over the whole range is obtained only by very simple arithmetical operations as represented in the expressions (5) and (6), and data interpolation based on the sampling function is made by simple arithmetical operations. In the expressions (5)and(6),when interpolation data is obtained for discrete data at a sampling point of notice, it is necessary to take into consideration only the discrete data at its adjacent sampling points. Accordingly, according to this embodiment, it is possible to not only obtain excellent interpolation data without phase distortion or truncation error of the low pass filter, but also shorten the operation time and simplify the operation circuit.

The data interpolating circuit as shown in FIG. 4 is one example of the circuit configuration for implementing the data interpolating method of the invention, but is not limited to this example.

For example, a first multiplication/addition circuit for adding the data output from the output taps of three D-type flip-flops and multiplied by −1, 8 and +1, and a second multiplication/addition circuit for adding the data output from the output taps of three D-type flip-flops and multiplied by +1, 8 and −1 may be provided apartly.

Figure 10:
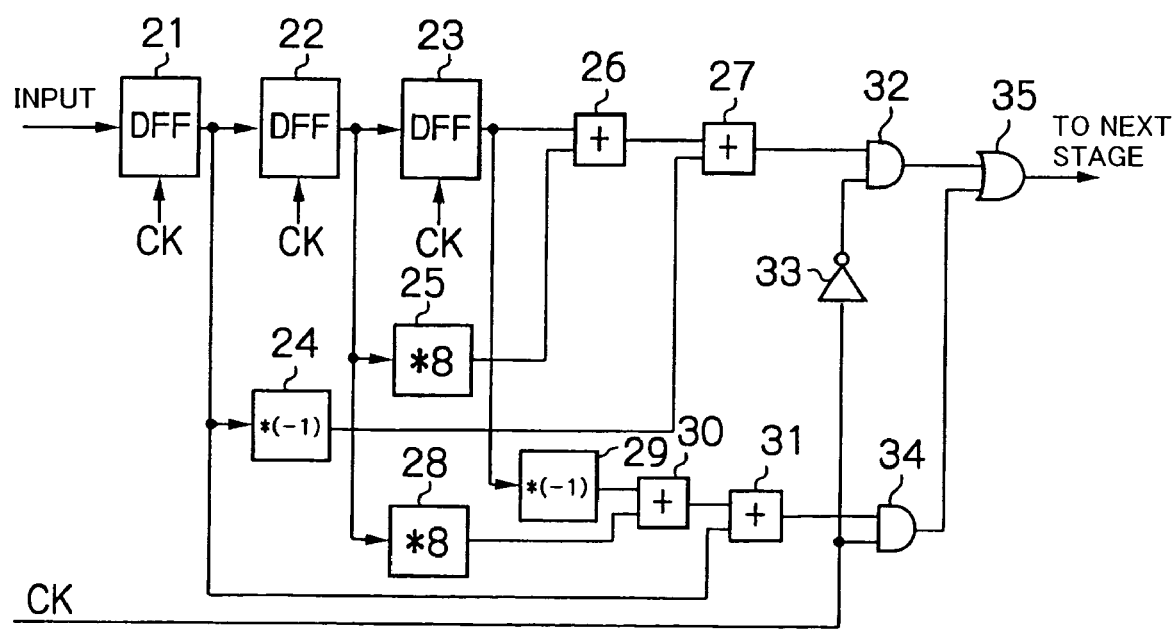
FIG. 10 is a diagram showing another configuration example of the data interpolating device according to the first embodiment.

FIG. 10 is a diagram showing a circuit configuration example in this case. Though a two-fold over-sampling circuit is only shown, the n same circuits may be cascade connected to make $2^n$-fold over-sampling in the same manner as in FIG. 4. The averaging circuit is not shown herein.

In FIG. 10, three stages of D-type flip-flops 21, 22 and 23 delay the sequentially inputted discrete data by every one clock CK successively. A first multiplication/addition circuit comprises a first multiplication unit 24 for multiplying the output data of a first stage D-type flip-flop 21 by −1, a second multiplication unit 25 for multiplying the output data of a second stage D-type flip-flop 22 by 8, and the adders 26 and 27 for adding the output data of the first multiplication unit 24, the output data of the second multiplication unit 25, and the output data of a third stage D-type flip-flop 23.

Also, a second multiplication/addition circuit comprises a third multiplication unit 28 for multiplying the output data of the second stage D-type flip-flop 22 by 8, a fourth multiplication unit 29 for multiplying the output data of the third stage D-type flip-flop 23 by −1, and the adders 30 and 31 for adding the output data of the third multiplication unit 28, the output data of the fourth multiplication unit 29, and the output data of the first stage D-type flip-flop 21.

Data outputted from the first multiplication/addition circuit (adder 27) is entered into one input terminal of an AND gate 32. A reverse clock CK passing through an inverter 33 is input at the other input end of the AND gate 32. Also, data outputted from the second multiplication/addition circuit (adder 31) is entered into one input terminal of an AND gate 34. A clock CK is input at the other input end of the AND gate 34.

The output data of the two AND gates 32 and 34 are output via an OR gate 35. Thereby, the operation result as indicated in the expression (5) is output from the OR gate 35 during the period for which the clock CK is at "H". Also, the operation result as indicated in the expression (6) is output from the OR gate 35 during the period for which the clock CK is at "L".

Figure 11:
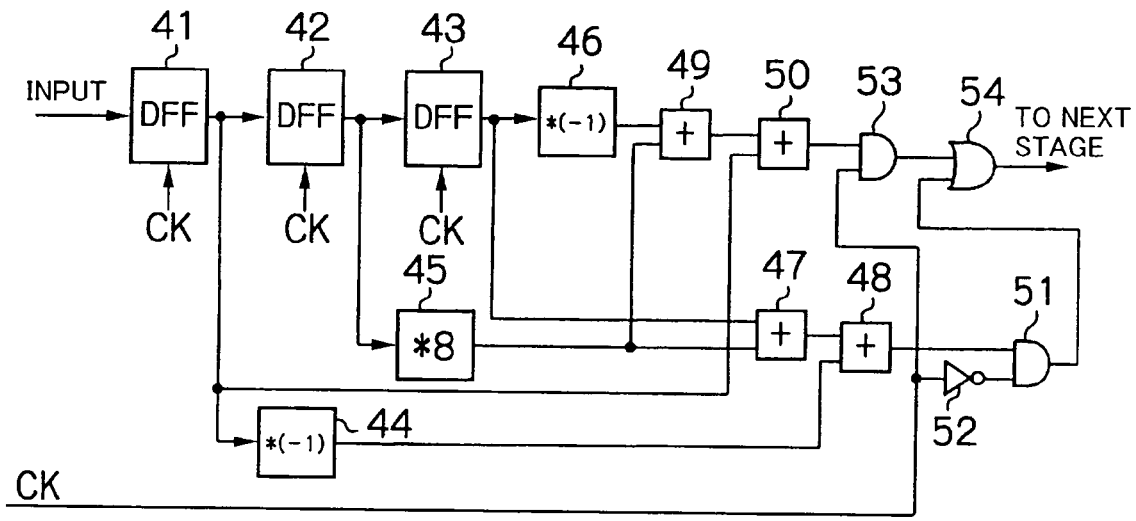
FIG. 11 is a diagram showing another configuration example of the data interpolating device according to the first embodiment.

Also, though two eight-fold multiplication units are employed in FIG. 10, a single multiplication unit may be employed as shown in FIG. 11. Though a two-fold over-sampling circuit is only shown in FIG. 11, the n same circuits may be cascade connected to make $2^n$-fold over-sampling. The averaging circuit is not shown herein.

The data interpolating device as shown in FIG. 11 comprises three stages of D-type flip-flops 41, 42 and 43 for delaying the sequentially inputted discrete data by every one clock CK successively. Also, it comprises a first multiplication unit 44 for multiplying the output data of a first stage D-type flip-flop 41 by −1, a second multiplication unit 45 for multiplying the output data of a second stage D-type flip-flop 42 by 8, and a third multiplication unit 46 for multiplying the output data of a third stage D-type flip-flop 43 by −1.

Further, it comprises the first adders 47 and 48 for adding the output data of the first multiplication unit 44, the output data of the second multiplication unit 45, and the output data of the third stage D-type flip-flop 43 and the second adders 49 and 50 for adding the output data of the second multiplication unit 45, the output data of the third multiplication unit 46, and the output data of the first stage D-type flip-flop 41.

Data outputted from an adder 48 is entered into one input terminal of an AND gate 51. A reverse clock CK passing through an inverter 52 is input at the other input end of the AND gate 51. Also, data outputted from an adder 50 is entered into one input terminal of an AND gate 53. A clock CK is input at the other input end of the AND gate 53.

The output data of the two AND gates 51 and 53 are output via an OR gate 54. Thereby, the operation result as indicated in the expression (5) is output from the OR gate 54 during the period for which the clock CK is at "H". Also, the operation result as indicated in the expression (6) is output from the OR gate 54 during the period for which the clock CK is at "L".

In the above embodiment, data interpolation is performed by making the arithmetical operation as shown in the expressions (5) and (6), and a deviation in the relative position of clock is compensated by making the averaging operation of obtained interpolation data. On the contrary, the averaging operation may be omitted by directly making the arithmetical operation as shown in the expression (7).

When the arithmetical operation as shown in the expression (7) is directly made, the weighted addition of discrete data at two adjacent sampling points of notice and discrete data at directly adjacent sampling points is performed according to the value of a digital basic function when the discrete data are sequentially inputted and thereby interpolation data interpolating the discrete data between two sampling points is successively determined. For example, when two discrete data of notice are B and C, interpolation data (B+C)/2 between them is obtained as in the following expression.

$$(B+C)/2 = (-A + 9B + 9C - D)/16 \qquad (8)$$

Figure 12:
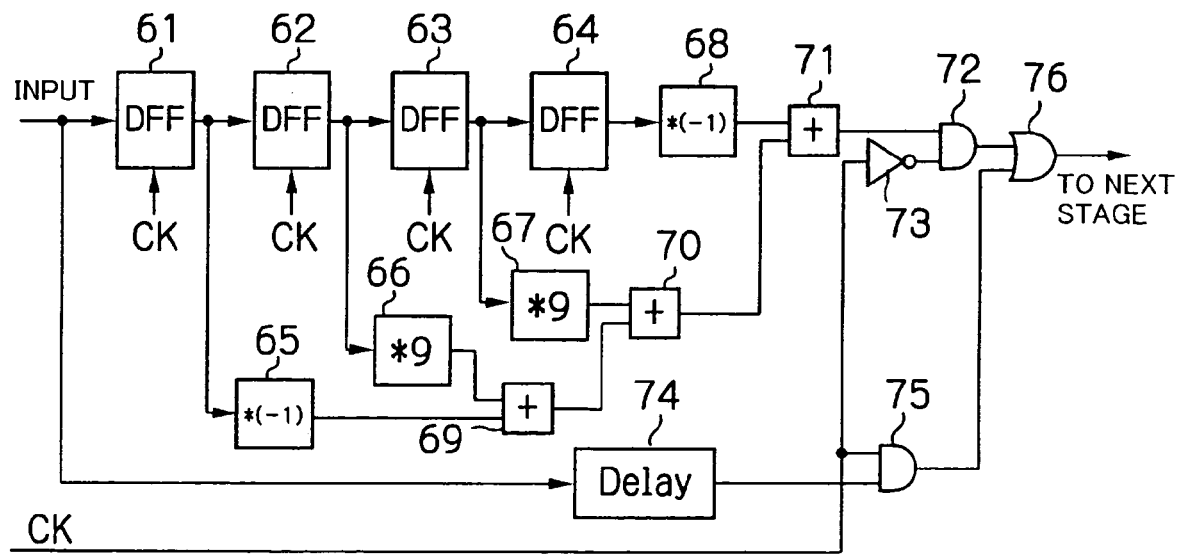
FIG. 12 is a diagram showing another configuration example of the data interpolating device according to the first embodiment.

FIG. 12 is a diagram showing a circuit configuration example in this case. Though a two-foldover-sampling circuit is only shown here, then same circuits may be cascade connected to make $2^n$-fold over-sampling.

The data interpolating device as shown in FIG. 12 comprises four stages of D-type flip-flops 61, 62 63 and 64 for delaying the sequentially inputted discrete data by every one clock CK successively. The four stages of D-type flip-flops 61 to 64 correspond to the four stages of delay circuits according to the invention.

Also, it comprises a first multiplication unit 65 for multiplying the output data of a first stage D-type flip-flop 61 by −1, a second multiplication unit 66 for multiplying the output data of a second stage D-type flip-flop 62 by 9, a third multiplication unit 67 for multiplying the output data of a third stage D-type flip-flop 63 by 9, and a fourth multiplication unit 68 for multiplying the output data of a fourth stage D-type flip-flop 64 by −1. Moreover, it comprises the adders 69, 70 and 71 for adding all the output data of the first to fourth multiplication units 65 to 68.

Data outputted from an adder 71 is entered into one input terminal of an AND gate 72. A reverse clock CK passing through an inverter 73 is input at the other input end of the AND gate 72. Also, the discrete data entered in to the first stage D-type flip-flop 61 is input via a delay circuit 74 for delaying data by an amount corresponding to a delay of each circuit block 61 to 71 at one input terminal of the AND gate 75. A clock CK is input at the other input end of the AND gate 75.

The output data of the two AND gates 72 and 75 are output via an OR gate 76. Thereby, the input discrete data is directly output from the OR gate 76 during the period for which the clock CK is at "H". Also, the interpolation data as indicated in the expression (8) is output from the OR gate 76 during the period for which the clock CK is at "L".

FIG. 12 is one circuit example for performing the operation of the expression (8), but the circuit for performing the operation of the expression (8) is not limited to this example. For example, the following configuration may be employed instead of the multiplication/addition circuits 65 to 71 as shown in FIG. 12. That is, the multiplication/addition circuit comprises a first adder for adding the output data of the first stage D-type flip-flop 61 and the output data of the fourth stage D-type flip-flop 64, a second adder for adding the output data of the second D-type flip-flop 62 and the output data of the third stage D-type flip-flop 63, a first multiplication unit for multiplying the output data of the first adder by −1, a second multiplication unit for multiplying the output data of the second adder by 9, and a third adder for adding the output data of the first multiplication unit and the output data of the second multiplication unit. In this manner, the number of multiplication units is reduced.

(Second Embodiment)

A second embodiment of the invention will be described below. In the second embodiment, a function in which the digital basic function of FIG. 15 shifted by every one clock is added (averaged) is employed.

FIG. 13 is a diagram for explaining a principle of data interpolation according to the second embodiment. In a data structure as shown in FIG. 13, A, B, C, . . . along the transverse axis indicate discrete data at each sampling point sequentially inputted at every clock, in which its data value becomes a coefficient of a digital basic function in this embodiment. Also, a, b, c, . . . along the longitudinal axis indicate a central position of discrete data processed by the digital basic function.

As shown in FIG. 13, the digital basic function for discrete data A is given by shifting each function value (−1, 0, 9, 16, 9, 0, −1) by every one clock from the start point that is two clocks ahead of the first clock position. Also, the digital basic function for the next discrete data B is given by shifting each function value by every one clock from the start point that is the first clock position. Similarly, the digital basic function for discrete data C, D, E, F, . . . sequentially inputted is given by shifting each function value by every one clock from the start point that is a clock-position more two clocks delayed.

With this data structure, the central position c of the digital basic function processed according to the value of discrete data C lies on one data position, unlike the first embodiment. Thus, in the second embodiment, the convolution operation is performed employing data at the clock position c and data at the clock positions before and after the clock position c to determine two interpolation data C1 and C2 from one thinned data C.

Supposing three lines of data located at the clock position c and before and after it are c−, c and c+, they are represented such as $$c-=-A+9B+9C-D \quad (9)$$

$$c=16C \quad (10)$$

$$c+=-B+9C+9D-E \quad (11)$$

From the above expressions (9) and (10), $$(c-+c)=(-A+9B+25C-D) \quad (12)$$

is obtained. And from the above expressions (10) and (11), $$(c+c+)=(-B+25C+9D-E) \quad (13)$$

is obtained.

Taking into consideration an amount of adjusting the amplitude based on the expressions (12) and (13), one discrete data is replaced with two interpolation data C1 and C2, which are represented such as $$C1=(-A+9B+25C-D)/32 \quad (14)$$

$$C2=(-B+25C+9D-E)/32 \quad (15)$$

Also, the relation as represented by the expressions (14) and (15) for the discrete data C holds for other discrete data D, E, F, . . . . Accordingly, one discrete data D is replaced with two interpolation data D1 and D2, one discrete data E is replaced with two interpolation data E1 and E2, and one discrete data F is replaced with two interpolation data F1 and F2, as shown in the following expression.

$$D \rightarrow D1=(-B+9C+25D-E)/32, \ D2=(-C+25D+9E-F)/32$$

$$E \rightarrow E1=(-C+9D+25E-F)/32, \ E2=(-D+25E+9F-G)/32$$

$$F \rightarrow F1=(-D+9E+25F-G)/32, \ F2=(-E+25F+9G-H)/32$$

As above described, when the interpolation value is obtained for the discrete data (e.g., C) at a certain sampling point, the value of its discrete data multiplied by 25, the value of the discrete data at the previous sampling point multiplied by 9, the value of the discrete data ahead of two sampling points multiplied by −1, and the value of the discrete data at next sampling point multiplied by −1 are added, and the added value is divided by 8 to obtain a first interpolated value (e.g., C1).

Also, the value of the discrete data of object multiplied by 25, the value of the discrete data at the previous sampling point multiplied by −1, the value of the discrete data at the next sampling point multiplied by 9, and the value of the discrete data after two sampling points multiplied by −1 are added, and the added value is divided by 8 to obtain a second interpolation value (e.g., C2).

By performing this operation for each sampling point, the original data is over-sampled twice.

Also, if the same interpolating process is performed based on the interpolation data over-sampled twice, the original data is over-sampled four times. Moreover, if the same interpolating process is performed based on the interpolation data over-sampled four times, the original data is over-sampled eight times. Theoretically, if the same interpolating process is repeated n times, the original data is over-sampled $2^n$ times.

Figure 14:
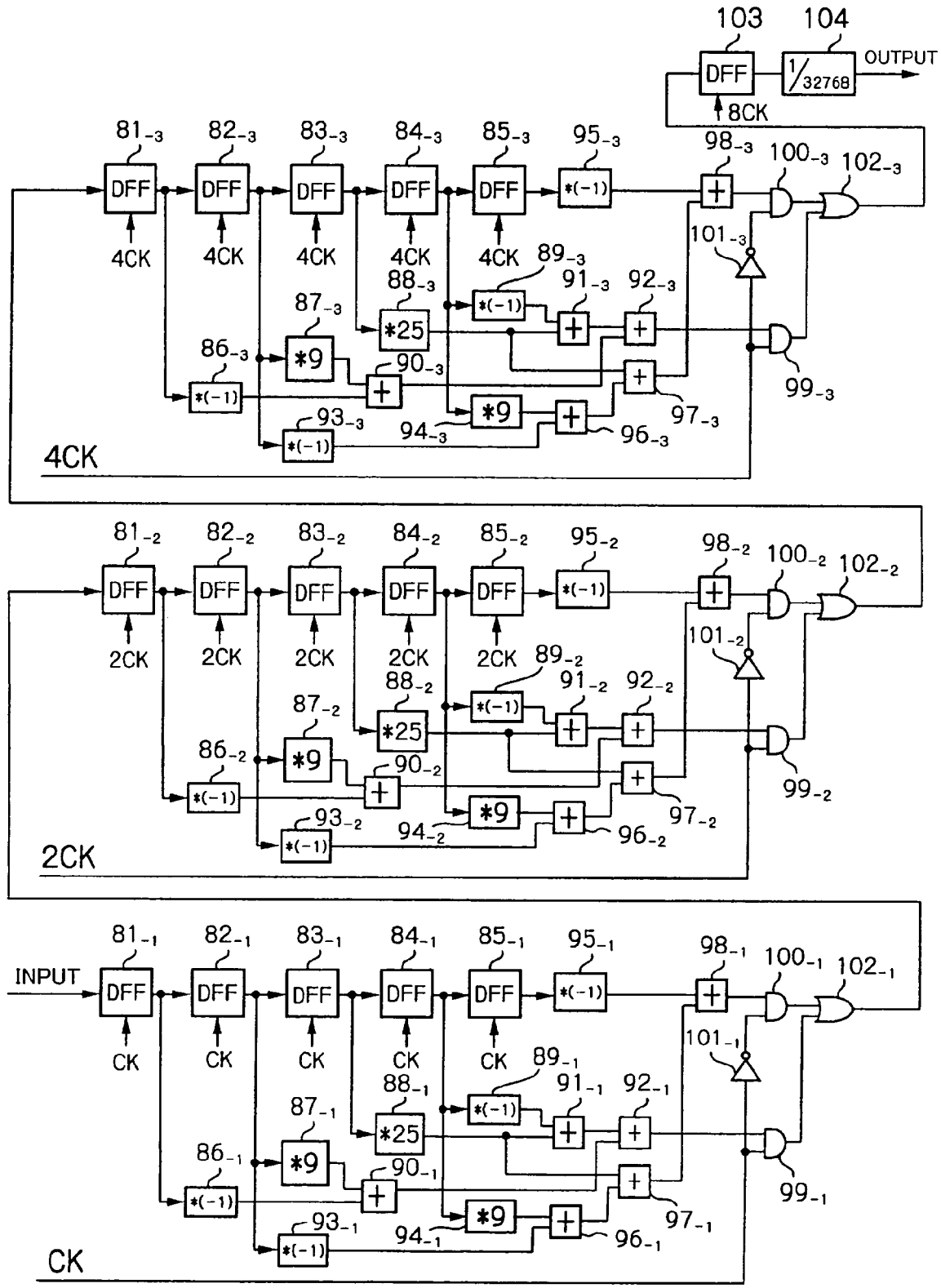
FIG. 14 is a diagram showing a configuration example of the data interpolating device according to the second embodiment.

FIG. 14 is a diagram showing a configuration example of the data interpolating device according to the second embodiment. The data interpolating device as shown in FIG. 14 is configured such that three stages of two-fold over-sampling circuits are cascade connected, in which the circuit configurations at the first to third stages are distinguished by subscript (−1 to −3). Also, the circuit configuration having the same main symbol with different subscript has the same function.

The first stage over-sampling circuit operates in accordance with the clock CK of a reference frequency (e.g., 44.1 KHz). Five stages of D-type flip-flops $81_{-1}$, $82_{-1}$, $83_{-1}$, $84_{-1}$ and $85_{-1}$ delay the sequentially inputted discrete data (e.g., 16 bits) by every one clock CK of the reference frequency successively. These D-type flip-flops $81_{-1}$ to $85_{-1}$ correspond to five stages of delay circuits as defined in claim 13 of the invention.

Data taken out from the output tap of the first stage D-type flip-flop $81_{-1}$ is entered into a −1 time multiplication unit $86_{-1}$ (corresponding to the first multiplication unit as defined in claim 14). Data taken out from the output tap of the second stage D-type flip-flop $82_{-1}$ is entered into a +9 times multiplication unit $87_{-1}$ (corresponding to the second multiplication unit as defined in claim 14) and a −1 time multiplication unit $93_{-1}$ (corresponding to the fifth multiplication unit as defined in claim 14).

Data taken out from the output tap of the third stage D-type flip-flop $83_{-1}$ is entered into a 25 times multiplication unit $88_{-1}$ (corresponding to the third multiplication unit as defined in claim 14). Data taken out from the output tap of the fourth stage D-type flip-flop $84_{-1}$ is entered into a −1 time multiplication unit $89_{-1}$ (corresponding to the fourth multiplication unit as defined in claim 14) and a +9 times multiplication unit $94_{-1}$ (corresponding to the sixth multiplication unit as defined in claim 14). Data taken out from the output tap of the fifth stage D-type flip-flop $85_{-1}$ is entered into a −1 time multiplication unit $95_{-1}$ (corresponding to the seventh multiplication unit as defined in claim 14).

The output data of the −1 time multiplication unit $86_{-1}$, the 9 times multiplication unit $87_{-1}$, the 25 times multiplication unit $88_{-1}$ and the −1 time multiplication unit $89_{-1}$ are all added by three adders $90_{-1}$, $91_{-1}$ and $92_{-1}$. The output data of the −1 time multiplication unit $93_{-1}$, the 25 times multiplication unit $88_{-1}$, the 9 times multiplication unit $94_{-1}$ and the −1 time multiplication unit $95_{-1}$ are all added by three adders $96_{-1}$, $97_{-1}$ and $98_{-1}$.

Data output from the adder $92_{-1}$ is input into one input terminal of an AND gate $99_{-1}$. A clock CK is input at the other input end of an AND gate $99_{-1}$. Also, data output from the adder $98_{-1}$ is input into one input terminal of an AND gate $100_{-1}$. A reverse clock CK passing through an inverter $101_{-1}$ is input at the other input end of the AND gate $100_{-1}$.

The output data of the two AND gates $99_{-1}$ and $100_{-1}$ are output via an OR gate $102_{-1}$. Thereby, the operation result of the expression (14) is output from the OR gate $102_{-1}$ during the period for which the clock CK is at "H", and the operation result of the expression (15) is output from the OR gate $102_{-1}$ during the period for which the clock CK is at "L".

If the discrete data A, B, C, . . . as shown in FIG. 13 is sequentially input into the above circuit, the interpolation data over-sampled twice such as A, B, C1, C2, D1, D2, . . . are output from the OR gate $102_{-1}$. Though the data value is wholly multiplied by 1/32 in the expressions (14) and (15), no circuit therefor is provided in the first stage over-sampling circuit. In the circuit of FIG. 14, data at three stages are multiplied by 1/32768 (1/32$^3$) in a multiplication unit 104 at the final stage.

The output data of the OR gate $102_{-1}$ is input into the D-type flip-flop $81_{-2}$ of the second stage over-sampling circuit, so that the two-fold over-sampling at the second stage is performed. The over-sampling circuit at the second stage is the same as that at the first stage, except that it operates in accordance with the clock 2CK that is twice the reference frequency.

The output data of the OR gate $102_{-2}$ provided at the final stage of the second stage over-sampling circuit is input into the D-type flip-flop $81_{-30}$ of the third stage over-sampling circuit, so that the two-fold over-sampling at the third stage is performed. The over-sampling circuit at the third stage is the same as that at the first stage, except that it operates in accordance with the clock 4CK that is four times the reference frequency.

The output data of the OR gate $102_{-3}$ provided at the final stage of the three stage over-sampling circuit is held in the D-type flip-flop 103 in accordance with the clock 8CK of eight-fold frequency, and then output via the 1/512 times multiplication unit 104.

When the data interpolating device is configured as shown in FIG. 14, the sampling function obtained in inputting the unit pulse data is the almost same waveform as indicated by #4 in FIG. 6. Accordingly, in the case where the data interpolating process of the second embodiment is applied, it is possible to interpolate more smoothly the value between each discrete data, employing the first or higher order differentiable function. Thereby, the low pass filter is dispensed with, and the degradation in the phase characteristic is prevented.

Also, in the case where the interpolation value for one discrete data is obtained, it is only necessary to take into consideration the values for a limited number of discrete data (four as represented in the expressions (14) and (15)), whereby it is possible to reduce the processing amount significantly. Though each discrete data outside the range of finite supports should be naturally considered, but are not ignored in consideration of the processing amount or precision. Theoretically, there is no need for considering them, whereby it is possible to prevent a truncation error from occurring.

Figure 15:
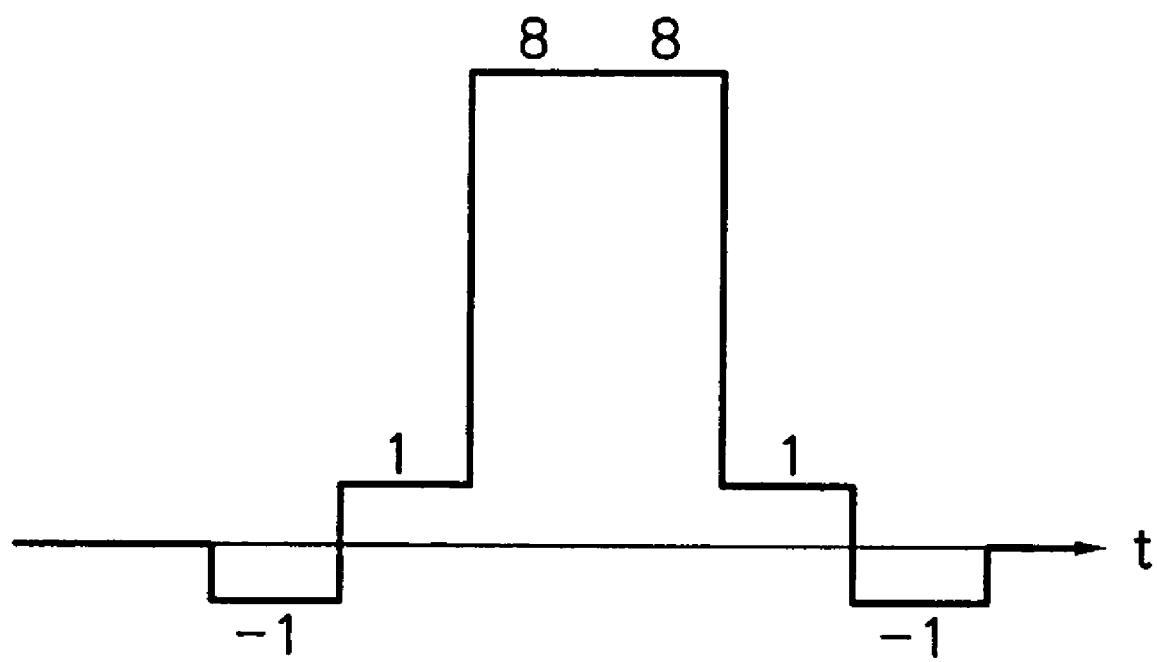
FIG. 15 is a graph showing a digital basic function for use with this embodiment.

Also, in the second embodiment, interpolation data is obtained employing a function in which the digital basic function of FIG. 15 shifted by every one clock is added (averaged) as shown in FIG. 13, whereby the averaging operation is already performed in this function. Accordingly, there is no need for performing the averaging operation after the interpolating operation in accordance with the expressions (14) and (15), whereby the averaging circuit is omitted.

In the first and second embodiments, the digital basic function has the data value changed at every clock such as −1, 1, 8, 8, 1 and −1. Though these numerical values are optimal, the digital basic function may have other numerical values (e.g., weight at both ends is not −1 but 1 or 0, weight at the center is other than 8). Even in this case, the excellent interpolation data interpolating smoothly between each discrete data is obtained through the simple operation as compared with when the sinc function is conventionally employed.

The method of data interpolation according to the first and second embodiments as described above may be implemented by any of the hardware, DSP and software configuration. For example, when this method is implemented by software, the data interpolating device of this embodiment is actually composed of CPU, MPU, RAM and ROM in the computer to execute a program stored in the RAM or ROM.

Accordingly, the method is implemented by storing the program for enabling the computer to perform the functions of the above embodiments in the recording medium such as CD-ROM, and read the program when executed. The recording medium for recording the program may be the floppy disk, hard disk, magnetic tape, optical disk, optical magnetic disk, DVD, or a non-volatile memory card, other than CD-ROM. Also, the program may be downloaded into the computer over a network such as the Internet.

Also, the computer may perform the supplied program to implement the functions of the above embodiments, but also the program in cooperation with the OS (Operating System) or other application software to implement their functions. Moreover, all or part of the processing of the supplied program may be performed in a function extension board or a function extension unit of the computer to implement the functions of the above embodiments. These programs are also included within the embodiments of the invention.

The data interpolating device as shown in FIGS. 4 and 14 performs the data interpolation by sequentially inputting a plurality of discrete data, but may be employed as a sampling function generating device for generating the sampling function as indicated by #4 in FIG. 6 by inputting the single digital data.

Also, the data interpolating device may be applied to the digital-analog conversion for converting discrete digital data to a continuous analog signal, the expansion process for restoring the original data by interpolation from the data discretized at the time of compression, and the enlargement process of image data, for example.

In this case, each of the above embodiments only illustrates a specific example for practicing the invention, but a technical scope of the invention may not be limitatively construed by the above embodiments. That is, this invention may be practiced in various ways or forms without departing from the scope or spirit of the invention.

As described above, with this invention, when the discrete data are sequentially inputted, interpolation data is determined by performing weighted addition of discrete data at a sampling point of notice and discrete data at sampling points around the sampling point of notice according to the value of a digital basic function, whereby the sampling function of finite supports differentiable once or more times over the whole range is obtained only by very simple arithmetical operations, and smooth data interpolation based on the sampling function is made by simple arithmetical operations. Accordingly, it is possible to not only obtain excellent interpolation data without phase distortion or truncation error of the low pass filter, but also shorten the operation time and simplify the operation circuit.

INDUSTRIAL APPLICABILITY

This invention allows smooth data interpolation to be made based on the sampling function of finite supports differentiable once or more times over the whole range by very simple arithmetical operations, whereby it is possible to shorten the operation time and simplify the operation circuit.

What is claimed is:

1. A data interpolating device, comprising:
three stages of delay circuits for successively delaying discrete data sequentially inputted; and
a multiplication/addition circuit that performs weighted addition of data outputted from the output stages of said three stages of delay circuits according to the value of a digital basic function and thereby determines interpolation data for said discrete data sequentially inputted,
said multiplication/addition circuit comprising:
a first multiplication unit for multiplying the output data of a first stage delay circuit by −1;
a second multiplication unit for multiplying the output data of a second stage delay circuit by 8;
a third multiplication unit for multiplying the output data of a third stage delay circuit by −1;
a first switching circuit for selectively switching between the output data of said first stage delay circuit and the output data of said first multiplication unit;
a second switching circuit for selectively switching between the output data of said third stage delay circuit and the output data of said third multiplication unit; and
an adder for adding the output data of said second multiplication unit, the output data of said first switching circuit and the output data of said second switching circuit.

2. A data interpolating device, comprising:
three stages of delay circuits for successively delaying discrete data sequentially inputted; and
a multiplication/addition circuit that performs weighted addition of data outputted from the output stages of said three stages of delay circuits according to the value of a digital basic function and thereby determines interpolation data for said discrete data sequentially inputted,
said multiplication/addition circuit comprising:
a first multiplication/addition circuit composed of a first multiplication unit for multiplying the output data of the first stage delay circuit by −1, a second multiplication unit for multiplying the output data of the second stage delay circuit by 8, and an adder for adding the output data of said first multiplication unit, the output data of said second multiplication unit, and the output data of the third stage delay circuit;
a second multiplication/addition circuit composed of a third multiplication unit for multiplying the output data of the second stage delay circuit by 8, a fourth multiplication unit for multiplying the output data of the third stage delay circuit by −1, and an adder for adding the output data of said third multiplication unit, the output data of said fourth multiplication unit, and the output data of said first stage delay circuit; and
a switching circuit for selectively switching between the output data of said first multiplication/addition circuit and the output data of said second multiplication/addition circuit.

3. A data interpolating device, comprising:
three stages of delay circuits for successively delaying discrete data sequentially inputted; and
a multiplication/addition circuit that performs weighted addition of data outputted from the output stages of said three stages of delay circuits according to the value of a digital basic function and thereby determines interpolation data for said discrete data sequentially inputted,
said multiplication/addition circuit comprising:
a first multiplication unit for multiplying the output data of the first stage delay circuit by −1;
a second multiplication unit for multiplying the output data of the second stage delay circuit by 8;
a third multiplication unit for multiplying the output data of the third stage delay circuit by −1;
a first adder for adding the output data of said first multiplication unit, the output data of said second multiplication unit, and the output data of said third stage delay circuit;
a second adder for adding the output data of said second multiplication unit, the output data of said third multiplication unit, and the output data of said first stage delay circuit; and
a switching circuit for selectively switching between the output data of said first adder and the output data of said second adder.

4. A data interpolating device, comprising:
plural stages of delay circuits for successively delaying discrete data sequentially inputted;
a multiplication/addition circuit that performs weighted addition of data outputted from the output stages of said plural stages of delay circuits according to the value of a digital basic function and thereby determines interpolation data for said discrete data sequentially inputted; and
an averaging circuit for calculating the average data of adjacent interpolation data output from said multiplication/addition circuit.

5. The data interpolating device according to claim 4, a plurality of over-sampling circuits are cascade connected, when one set of over-sampling circuit comprises said plural stages of delay circuits, said multiplication/addition circuit and said averaging circuit.

6. A data interpolating device, comprising:
four stages of delay circuits for successively delaying discrete data sequentially inputted; and
a multiplication/addition circuit that performs weighted addition of data outputted from the output stages of said four stages of delay circuits according to the value of a digital basic function and thereby determines interpolation data for said discrete data sequentially inputted,
said multiplication/addition circuit comprising:
a first multiplication unit for multiplying the output data of the first stage delay circuit by −1;
a second multiplication unit for multiplying the output data of the second stage delay circuit by 9;

a third multiplication unit for multiplying the output data of the third stage delay circuit by 9;

a fourth multiplication unit for multiplying the output data of the fourth stage delay circuit by −1;

an adder for adding the output data of said first to fourth multiplication units; and a switching circuit for selectively switching between the output data of said adder and the discrete data input into said first stage delay circuit.

7. A data interpolating device, comprising:

five stages of delay circuits for successively delaying discrete data sequentially inputted; and a multiplication/addition circuit that performs weighted addition of data outputted from the output stages of said five stages of delay circuits according to the value of a digital basic function and thereby determines interpolation data for said discrete data sequentially inputted, said multiplication/addition circuit comprising:

a first multiplication/addition circuit composed of a first multiplication unit for multiplying the output data of the first stage delay circuit by −1, a second multiplication unit for multiplying the output data of the second stage delay circuit by 9, a third multiplication unit for multiplying the output data of the third stage delay circuit by 25, a fourth multiplication unit for multiplying the output data of the fourth stage delay circuit by −1, and an adder for adding the output data of said first to fourth multiplication units;

a second multiplication/addition circuit composed of a fifth multiplication unit for multiplying the output data of said second stage delay circuit by −1, a sixth multiplication unit for multiplying the output data of said fourth stage delay circuit by 9, a seventh multiplication unit for multiplying the output data of said fifth multiplication unit by −1, and an adder for adding the output data of said third multiplication unit and the output data of said fifth to seventh multiplication units; and a switching circuit for selectively switching between the output data of said first multiplication/addition unit and the output data of said second multiplication/addition unit.

8. A data interpolating device, comprising:

data acquisition means for acquiring discrete data at a sampling point of notice and discrete data at neighboring sampling points around said sampling point of notice when the discrete data are sequentially inputted; and interpolation means that performs weighted addition of discrete data acquired by said data acquisition means according to the value of a digital basic function and thereby determines interpolation data for said discrete data at said sampling point of notice successively, the operation of said data acquisition means and said interpolation means is repeated multiple times by setting the output data of said interpolation means as the input of said data acquisition means.

9. A data interpolating device, comprising:

data acquisition means for acquiring discrete data at a sampling point of notice and discrete data at neighboring sampling points around said sampling point of notice when the discrete data are sequentially inputted; and interpolation means that performs weighted addition of discrete data acquired by said data acquisition means according to the value of a digital basic function and thereby determines interpolation data for said discrete data at said sampling point of notice successively; and averaging means for performing an averaging operation of adjacent interpolation data for the interpolation data determined by said interpolation means.

10. A data interpolating method, comprising:

performing weighted addition of discrete data at a sampling point of notice and discrete data at surrounding sampling points around said sampling point of notice according to the value of a digital basic function and thereby determining interpolation data for said discrete data at said sampling point of notice, when the discrete data are sequentially inputted; and replacing discrete data sequentially inputted with two interpolation data determined by performing weighted addition of said discrete data according to the value of said digital basic function.

11. The data interpolating method according to claim 10, further comprising:

performing an averaging operation of adjacent interpolation data for said interpolation data determined by performing weighted addition of said discrete data according to the value of said digital basic function.

12. A data interpolating method, comprising:

performing weighted addition of discrete data at a sampling point of notice and discrete data at surrounding sampling points around said sampling point of notice according to the value of a digital basic function and thereby determining interpolation data for said discrete data at said sampling point of notice, when the discrete data are sequentially inputted; and performing weighted addition of interpolation data at a sampling point of notice and interpolation data at surrounding sampling points around said sampling point of notice according to the value of said digital basic function, when the interpolation data are determined by performing weighted addition of discrete data according to the value of said digital basic function, and thereby further determining interpolation data for said interpolation data at said sampling point of notice.

13. A data interpolating method, comprising:

performing wieghted addition of descrete data at a sampling point of notice and discrete data at its adjacent sampling points according to the value of a digital basic function when the discrete data are sequentially inputted and thereby successively determining interpolation data at two sampling points from the discrete data at said one sampling point; and performing an averaging operation of adjacent interpolation data for said determined interpolation data.

* * * * *